(12) United States Patent
Ohashi et al.

(10) Patent No.: US 6,487,224 B1
(45) Date of Patent: Nov. 26, 2002

(54) LASER DIODE ASSEMBLY

(75) Inventors: Makoto Ohashi, Kanagawa-ken (JP); Hideto Furuyama, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/408,122

(22) Filed: Sep. 29, 1999

(30) Foreign Application Priority Data

Sep. 30, 1998 (JP) ............................................ 10-278766

(51) Int. Cl.[7] ................................................ H01S 5/00
(52) U.S. Cl. ............................ 372/43; 372/44; 372/45; 372/40; 372/47; 372/48; 372/49; 372/50; 372/36; 372/99
(58) Field of Search ............................ 372/43, 99, 50, 372/36, 44, 45, 46, 47, 48–49; 359/13, 19, 22

(56) References Cited

U.S. PATENT DOCUMENTS 5,159,603 A * 10/1992 Kim ............................. 372/45
5,677,924 A * 10/1997 Bestwick ..................... 372/46

FOREIGN PATENT DOCUMENTS

JP 7-118087 12/1995

OTHER PUBLICATIONS

Akio Yoshikawa, et al., "Laser–Detector–Hologram Unit for Thin Optical Pick–up Head of a CD Player," IEEE Transactions On Components, Packaging, and Manufacturing Technology–Part B, vol. 18, No. 2, (May 1995), pp. 245–249.

* cited by examiner

*Primary Examiner*—Paul Ip
*Assistant Examiner*—Delma R. Flores Ruiz
(74) *Attorney, Agent, or Firm*—Oblon, Spivak, McClelland, Maier & Neustadt, P.C.

(57) ABSTRACT

A laser diode assembly capable of guiding a laser beam to a predetermined direction by utilizing a reflecting surface which has an arbitrary angle with respect to a sub-mount. The assembly includes a first unit, a second unit, and a laser diode. The first unit has a first surface and a mounting surface inclined to the first surface. The second unit is made of a semiconductor substrate and is on the first unit. The second unit has a second surface and a reflecting surface that coincides with a (111) surface of the semiconductor substrate inclined to the second surface. The laser diode is on the second surface and irradiates a laser beam to the reflecting surface along a direction parallel to the second surface. The second unit is on the first unit in a manner that the second surface is disposed parallel to the mounting surface. thereby realizing an inclined angle of the reflecting surface with respect to the first surface of 45 degrees.

19 Claims, 9 Drawing Sheets

LASER DIODE ASSEMBLY

BACKGROUND

1. Field of the Invention

The present invention relates to a laser diode assembly and more particularly to a laser diode assembly which is capable of guiding a laser beam to a direction perpendicular to the surface of a mount unit of the assembly.

2. Description of the Related Art

An edge emitting laser diode is known as a kind of laser diode assembly that is used to guide a laser beam to a direction parallel to the surface of the assembly. In order to transmit the laser beam by employing other optical components, such as an optical fiber, to the edge emitting laser diode, it is necessary to arrange an optical coupling unit such as a lens or a waveguide, or the optical fiber directly. to a vicinity of an exit of the laser beam. This arrangement makes it impossible to secure enough room to dispose a drive circuit, a beam detecting element, a beam emitting element, or a wire onto the assembly. This limits the flexible of designing the assembly. In addition. it is also impossible to miniaturize the assembly. by integrating the elements and the wires onto the same assembly. This constraint of arrangement becomes remarkable when laser diodes are integrated in high density onto the assembly in array manner.

With a surface emitting laser diode, on the contrary, high flexibility in designing can be achieved on wiring and integration, because an optical path needs not employed on the assembly. This can be advantageous of miniaturization and cost-efficiency of the assembly.

In recent years, an optical transmission system has been widely developed in order to realize a optical-subscriber system in the telecommunication area. In the optical transmission system. if a plastic optical fiber having a larger diameter can be utilized, the laser diode and the plastic optical fiber can be coupled directly without employing lenses. Accordingly, the number of parts on the assembly can be reduced To simulate a surface emitting laser diode, a mirror reflects a laser beam from an edge emitting laser diode to the perpendicular direction. A conventional (100) silicon substrate is usually employed as the mirror. However, a (111) surface, which corresponds to the mirror surface, is known to have 54.74 degree angle with respect to the (100) surface. This is described, for example, by Akio Yoshikawa. 'Laser-Detector-Hologram Unit for Thin Optical Pick-up Head of a CD Player' IEEE Transactions on Components, Packaging, and Manufacturing Technology Part B, Vol. 18, No. 2, May 1995 pp245–249. In order to obtain the laser beam to the perpendicular direction, a mirror having 45 degrees with respect to the surface of the substrate is required. Thus. the (111) surface of the mirror is manufactured to be 9.74 degrees off the (100) surface.

However, when the 45-degree-mirror is manufactured by etching of the 9.74-degree-off-angled (100) silicon substrate, the other surface which is simultaneously produced by etching has a 9.74-degree-added angle surface. This means that a mirror having a 64.47 degree angle with respect to the surface of the substrate is produced. Such a mirror having a 64.47 degree angle cannot be used as the surface emitting laser diode. Therefore. the number of sub-mounts having a useable mirror from a silicon wafer is reduced. Moreover. because a detecting surface of a photo detector placed on the sub-mount and an edge surface of the optical fiber are disposed in parallel, a laser beam which does not enter the photo detector but is reflected by both an upper surface of the sub-mount and the edge surface of the optical fiber enters the laser diode. This destabilizes the output of the laser diode.

The above discussion is focused on only the case when the laser beam is guided to the perpendicular direction with respect to the surface of the substrate. However. it is also difficult to guide the laser beam to arbitrary direction other than the perpendicular direction, as long as using such conventional and inexpensive silicon wafer which has fixed off angle and surface orientation of crystal is used.

In the conventional laser diode assembly as stated above, the 9.74-degree-off-angled (100) silicon substrate is used to produce the 45-degree-mirror of the (111) surface. However, unnecessary 64.47-degree-surface is simultaneously produced, and this makes impossible to increase the number of the sub-mount to be manufactured from a silicon wafer and thereby involving cost-increasing.

SUMMARY OF THE INVENTION

The present invention has been made in view of the above-mentioned circumstances and is intended to solve the above-mentioned problems. In particular, one purpose of the present invention is to provide a laser diode assembly capable of guiding the laser beam to a predetermined direction by utilizing the mirror surface which has arbitrary angle with respect to the sub-mount.

Additional purposes and advantages of the invention will be apparent to persons skilled in this field from the following description, or may be learned by practice of the invention.

The present invention provides a laser diode assembly including: a first unit having a first surface and a mounting surface inclined to the first surface: a second unit made of a semiconductor substrate on the first unit, the second unit having a second surface and a reflecting surface that coincides with a (111) surface of the semiconductor substrate inclined to the second surface; and a laser diode on the second surface for irradiating a laser beam to the reflecting surface along a direction parallel to the second surface; wherein the second surface is parallel to the mounting surface and an angle between the reflecting surface and the first surface is substantially 45 degrees.

An inclined angle of the mounting surface with respect to the first surface may be 19.48 degrees. and an inclined angle of the reflected surface with respect to the second surface may be 54.74 degrees. Similarly, an inclined angle of the mounting surface with respect to the first surface may be 38.94 degrees, and an inclined angle of the reflected surface with respect to the second surface may be 64.47 degrees.

The reflecting surface may be formed by an etching process. The second unit may include silicon, and the second surface may be a (100) silicon surface. Gold may be evaporated on the reflecting surface.

A step may be formed by the first surface and the mounting surface, and the step may be used to adjust at least one portion of the second unit.

The laser diode may be integrally manufactured on the second unit. A photo detector for detecting an optical signal may be disposed on the second unit An optical transceiver material may be disposed for guiding the laser beam to a predetermined position. The optical transceiver material may include an optical fiber. The laser diode may include a red semiconductor laser diode or a blue semiconductor laser diode.

The present invention also provides a mount unit including a first surface; and a mounting surface adjacent to the first surface, the angle between the first surface and the second surface being greater than 0 degree and less than 90 degrees, wherein a mounted unit on the mounting surface has a second surface parallel to the mounting surface and a reflecting surface adjacent to the second surface, the angle between the reflecting surface and the first surface being substantially 45 degrees.

The present invention further provides an optical head apparatus for recording/reproducing information onto/from an optical recording medium. including an optical head capable of moving relative to the optical recording medium, the optical head including a first unit having a first surface and a mounting surface inclined to the first surface; and a second unit comprising a semiconductor substrate on the first unit and having a second surface and a reflecting surface that coincides with a (111) surface of the semiconductor substrate inclined to the second surface; a laser diode on the second surface of the optical head for irradiating a laser beam to the reflecting surface along a direction parallel to the second surface; and a lens for condensing the laser beam onto the optical recording medium, wherein the second surface of the second unit is parallel to the mounting surface, and an angle between the reflecting surface and the first surface is substantially 45 degrees.

The present invention also provides a transceiver apparatus having at least a pair of terminals for transmitting/receiving optical information, the terminal includes: a first unit having a first surface and a mounting surface inclined to the first surface; a second unit made of a semiconductor substrate on the first unit, having a second surface and a reflecting surface that coincides with a (111) surface of the semiconductor substrate inclined to the second surface and a laser diode on the second surface for irradiating a laser beam to the reflecting surface along a direction parallel to the second surface: wherein the second surface is parallel to the mounting surface, and an angle between the reflecting surface and the first surface is substantially 45 degrees.

Further purposes, features and advantages of the invention will become apparent from the detailed description of preferred embodiments that allows, when considered together with the accompanying figures of drawings.

BRIEF DESCRIPTION OF DRAWINGS

The accompanying drawings, which are incorporated in and constitute a part of this specification, illustrate several preferred embodiments of the invention and, together with the description, serve to explain the principles of the invention.

DESCRIPTION OF PREFERRED EMBODIMENTS

Preferred embodiments of a laser diode assembly of the present invention will now be specifically described in more detail with reference to the accompanying drawings. Wherever possible, the same reference numbers will be used throughout the drawings to refer to the same or like parts.
(First Embodiment)

Figure 1A:
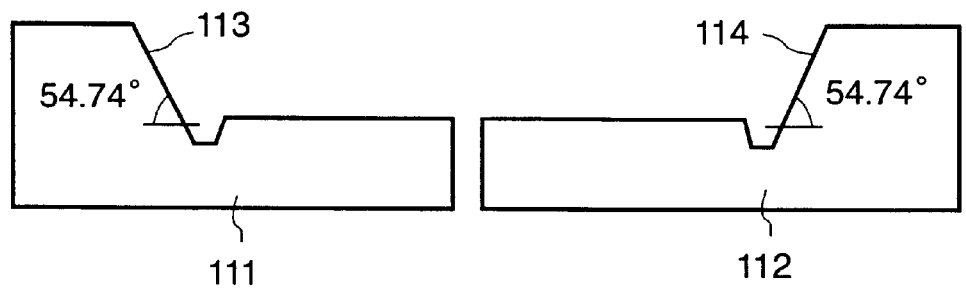
FIGS. 1A and 1B are sectional views showing schematic structures of a laser diode assembly according to a first embodiment of the present invention.
Figure 1B:
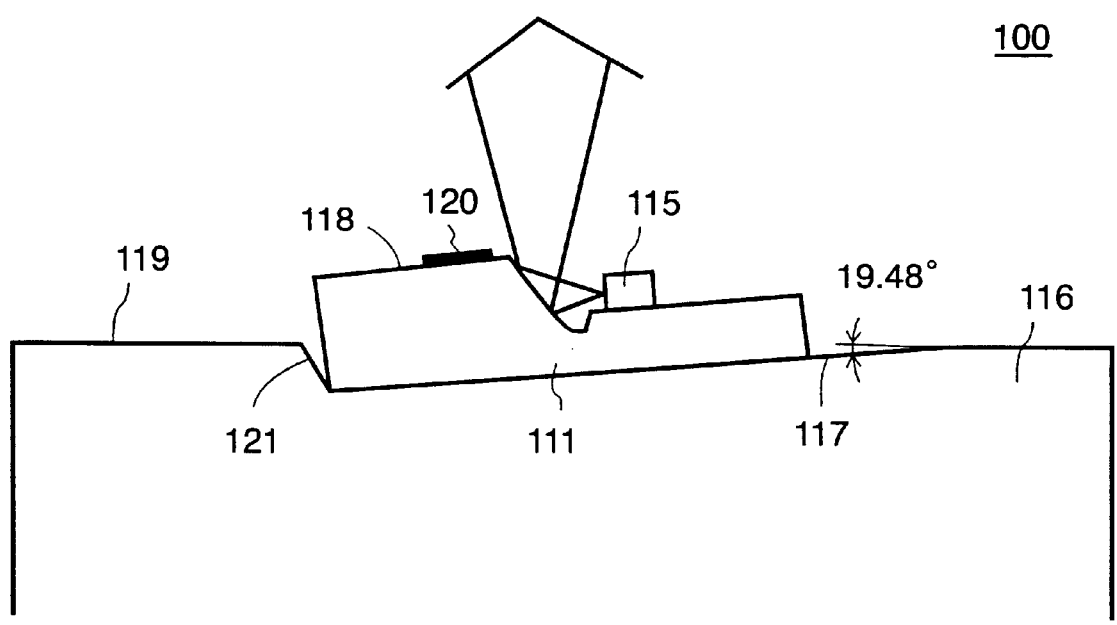

FIGS. 1A and 1B are sectional views showing schematic structures of a laser diode assembly according to a first embodiment of the present invention. Here, FIG. 1A shows a sub-mount of the laser diode assembly, and FIG. 1B shows the laser diode assembly constituted by the sub-mount disposed on a heat-sink.

In FIG. 1A, sub-mounts 111 and 112 (second unit) are made of a (100) silicon substrate. A (111) surface (reflecting surface) 113 of the sub-mount 111 is formed by anisotropic etching using an aqueous solution of potassium hydroxide. The (111) surface 113 forms a 54.74 degree angle with respect to a (100) surface of the silicon substrate. The (111) surface 113 is covered with a gold by a way of vacuum evaporation, so as to improve reflectivity thereof. Because etching forms the sub-mounts 111 and 112, another (111) surface 114 in a symmetric position is formed In the present invention. both sub-mounts 111 and 112 can be employed as micro-mirrors as well. The sub-mounts 111 and 112 can be manufactured to separate each other by means of dicing, cleavage and the like.

As shown in FIG. 1B, a laser diode 115 is on the sub-mount 111 having the (111) surface 113, and the sub-mount 111 is secured on a heat-sink (first unit) 116. The laser diode assembly 100, as shown in FIG. 1B, effectively acts as a surface emitting laser diode. A slanted surface (mounting surface) 117 is inclined 19.48 degrees with respect to a horizontal surface (first surface) 119, and the laser beam output from the laser diode 115 is guided to a vertical direction perpendicular to the horizontal surface 119. by securing the sub-mount 111 on the slanted surface 117 of the heatsink 116. In this situation, the slanted surface 117 on the heat-sink 116 and an upper surface (second surface) of the sub-mount 111 are set in parallel to each other. A groove 121, including the slanted surface 117. forms a V-shaped step, as shown in FIG. 1B. so that the sub-mount 111 can be adjusted to the predetermined position precisely and automatically. The groove 121 can be formed by etching, cutting, grinding and the like.

Assume that the returned laser beam, which is processed and guided back through an optical transceiver material such as an optical fiber. should enter a photo detector 120. If, however. the returning laser beam does not enter the photo detector 120. but is reflected by the upper surface 118 of the sub-mount 111, the laser beam reflected by the upper surface 118 travels 19.48 degrees with respect to the vertical direction. Thus, the structure of the present embodiment avoids re-entry of the reflected laser beam to the laser diode 115, thereby maintaining the stability of output power of the laser beam 115.

(Second Embodiment)

Figure 2:
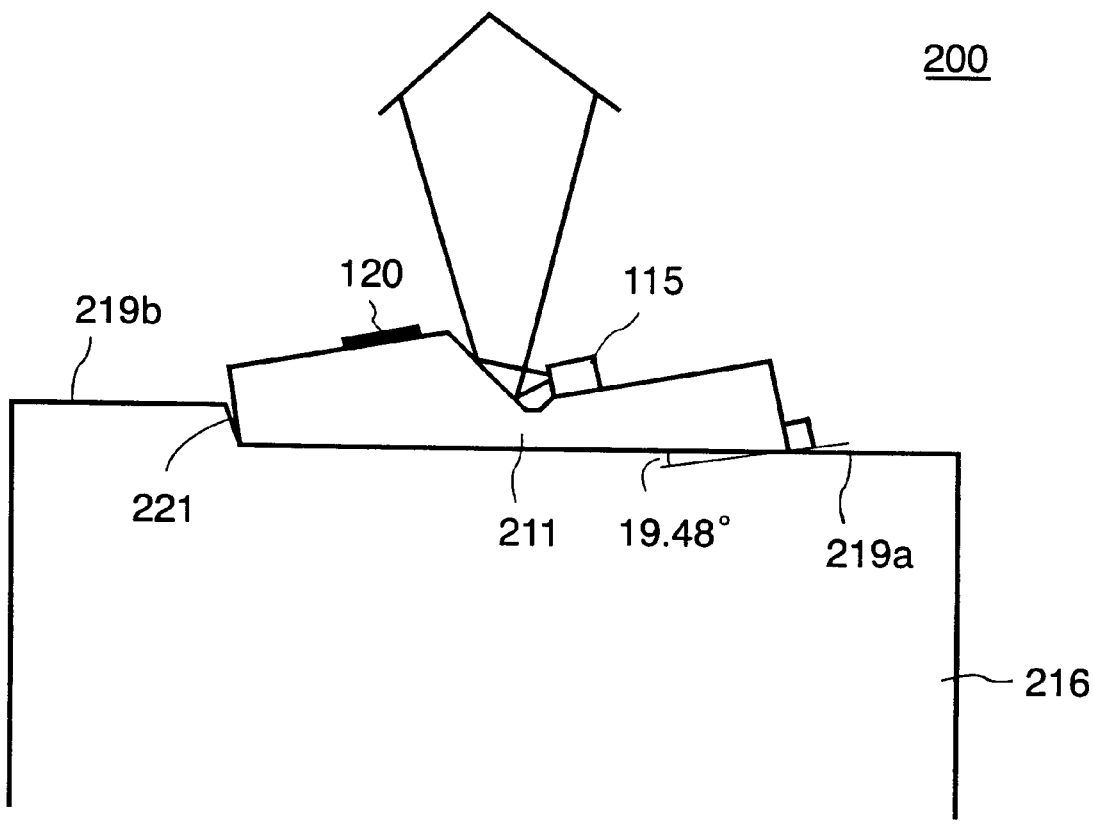
FIG. 2 is a sectional view showing a schematic structure of the laser diode assembly according to a second embodiment of the present invention.

FIG. 2 is a sectional view showing a schematic structure of the laser diode assembly according to a second embodiment of the present invention.

The difference between the laser diode assembly 200 of the second embodiment and that of the first embodiment is the position of the sub-mount secured on the mount. In the first embodiment, the slanted surface 117 is formed on the mount 116. However, in the second embodiment, the back side of a sub-mount 211 is formed so as to incline 19.48 degrees with respect to the front surface. The sub-mount 211 manufactured by such a manner is secured on a horizontal surface 219a of a mount 216. thereby realizing the laser diode assembly 200 capable of guiding laser beam to the vertical direction, similarly to the first embodiment. The back side of the sub-mount 211 can be formed by a way of cutting. grinding and the like.

Here, a rectangular step 221 between horizontal surfaces 219a and 219b can be used to adjust the sub-mount 211 to the predetermined position on the mount 216 precisely and automatically.

(Third Embodiment)

Figure 3:
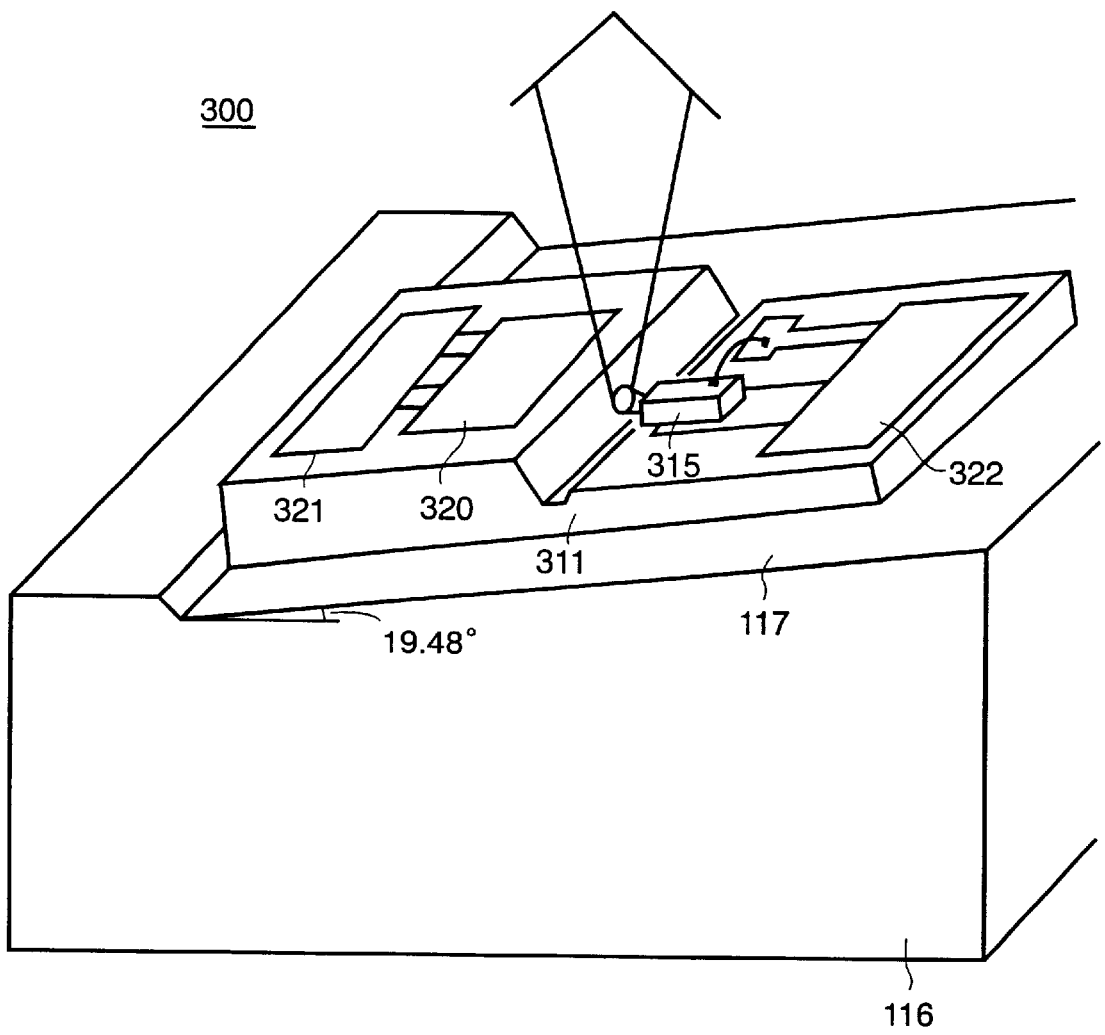
FIG. 3 is a perspective view showing a schematic structure of the laser diode assembly according to a third embodiment of the present invention.

FIG. 3 is a perspective view showing a schematic structure of the laser diode assembly according to a third embodiment of the present invention.

The difference between the laser diode assembly 300 of the third embodiment and that of the first embodiment is that the laser diode assembly 300 integrates a photo detector, a receiver circuit, and a driver circuit as well as the laser diode on a sub-mount 311 thereby providing a functional device.

In FIG. 3, numbers 320, 321 and 322 represent a photo detector, a receiver circuit, and a driver circuit, respectively. The receiver circuit 321 converts an optical signal, received by the photo detector 320 into an electrical signal. and the driver circuit 322 converts an electric signal into an optical signal to be output from a laser diode 315. In order to integrate the photo detector 320 and circuits 321 and 322 on the sub-mount 311. it is important to consider constituting the surface emitting laser diode assembly. This contributes miniaturization of the laser diode assembly 300 as a whole. In addition, placing the photo detector 320 and circuits 321 and 322 directly onto the sub-mount 311 made of the (100) silicon substrate saves time. effort, and money compared to placing those elements onto the 9.74-degree-off-angled silicon substrate.

The laser diode assembly 300 includes the photo detector 320 as well as the laser diode 315 and is thus applicable to other apparatus, such as a transceiver apparatus with an optical fiber and an optical head apparatus to be described later.

(Fourth Embodiment)

Figure 4A:
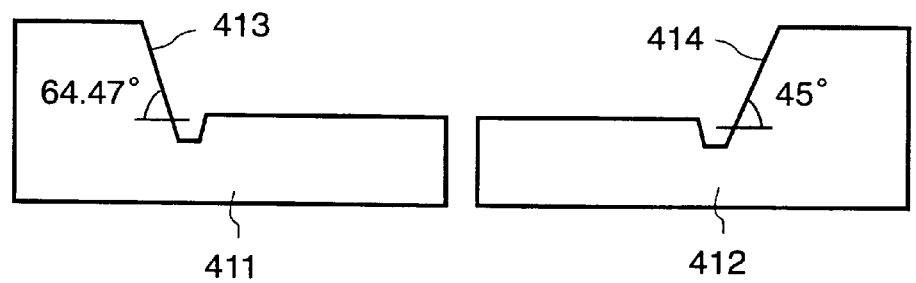
FIGS. 4A and 4B are sectional views showing a schematic structure of the laser diode assembly according to a fourth embodiment of the present invention.
Figure 4B:
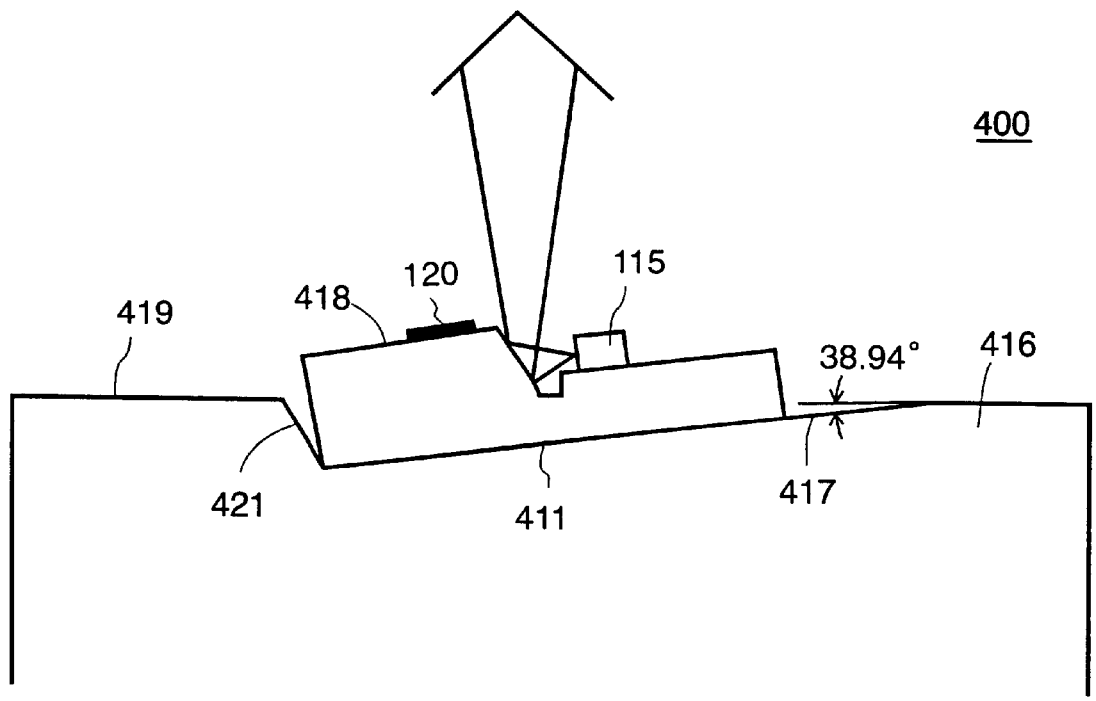

FIGS. 4A and 4B are sectional views showing a schematic structure of the laser diode assembly according to a fourth embodiment of the present invention. Here. FIG. 4A shows a sub-mount of the laser diode assembly. and FIG. 4B shows the laser diode assembly constituted by the sub-mount on a mount.

The difference between the laser diode assembly 400 of the fourth embodiment and that of the first embodiment is that a 9.74-degree-off silicon substrate is employed as a sub-mount instead of a (100) silicon substrate.

In FIG. 4A, a sub-mount 411 is made of a 9.74-degree-off silicon substrate. A (111) surface 413, which is inclined 64.47 degrees with respect to the substrate surface, is formed by anisotropic etching using the aqueous solution of potassium hydroxide and is covered with gold by way of vacuum evaporation, so as to improve the reflectivity thereof. In this case, another (111) surface 414, which is inclined 45 degrees with respect to the substrate surface, is provided together with the (111) surface 413 Needless to say, a sub-mount 412 having the (111) surface 414 can be equipped with the surface emitting laser diode, without employing the mount of the present invention. The sub-mounts 411 and 412 can be separated from each other by means of dicing. cleavage and the like.

As shown in FIG. 4B, the laser diode 115 is on the sub-mount 411 having the (111) surface 413, and the sub-mount 411 is secured on a heat-sink 416. The laser diode assembly 400, as shown in FIG. 4B, is a surface emitting laser diode as a whole. A slanted surface 417 is inclined 38.94 degrees with respect to a horizontal surface 419, and the laser beam output from the laser diode 115 is guided to a vertical direction perpendicular to the horizontal surface 419, by securing the sub-mount 411 on the slanted surface 417 of the heat-sink 416. A groove 421 including the slanted surface 417 forms a V-shaped step, as shown in FIG. 4B, so that the sub-mount 411 can be adjusted to the predetermined position precisely and automatically. The groove 421 can be formed by a way of etching, cutting, grinding and the like.

Assume that the returned laser beam, which is processed and guided back through an optical fiber, should enter a photo detector 120. If, however, the returning laser beam does not enter the photo detector 120, but is reflected by an upper surface 418 of the sub-mount 411, the laser beam reflected by the upper surface 418 travels 38.94 degrees with respect to the vertical direction. Thus, the structure of the present embodiment is capable of avoiding re-entry of the reflected laser beam to the laser diode 115, thereby maintaining the stability of output power of the laser beam 115. This advantage appears when the laser beam is guided to the optical fiber through a lens.

In this embodiment. the laser diode assembly 400 effectively acts as a surface emitting laser, by forming the slanted surface 417 on the mount 416. This embodiment also effectively acts as a surface emitting laser, when the back side of the sub-mount 411 is formed to be slanted 38.94 degrees, such as shown in the second embodiment, and the laser beam can be guided to the vertical direction.

(Fifth Embodiment)

Figure 5A:
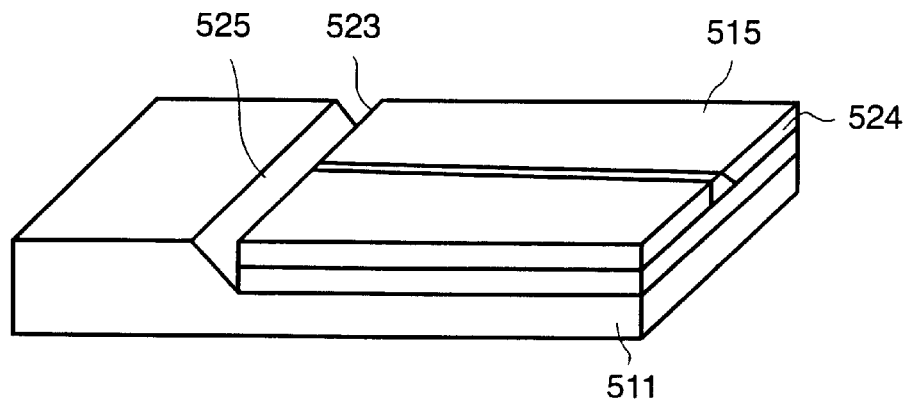
FIGS. 5A and 5B are sectional views showing a schematic structure of a laser diode assembly according to a fifth embodiment of the present invention.
Figure 5B:
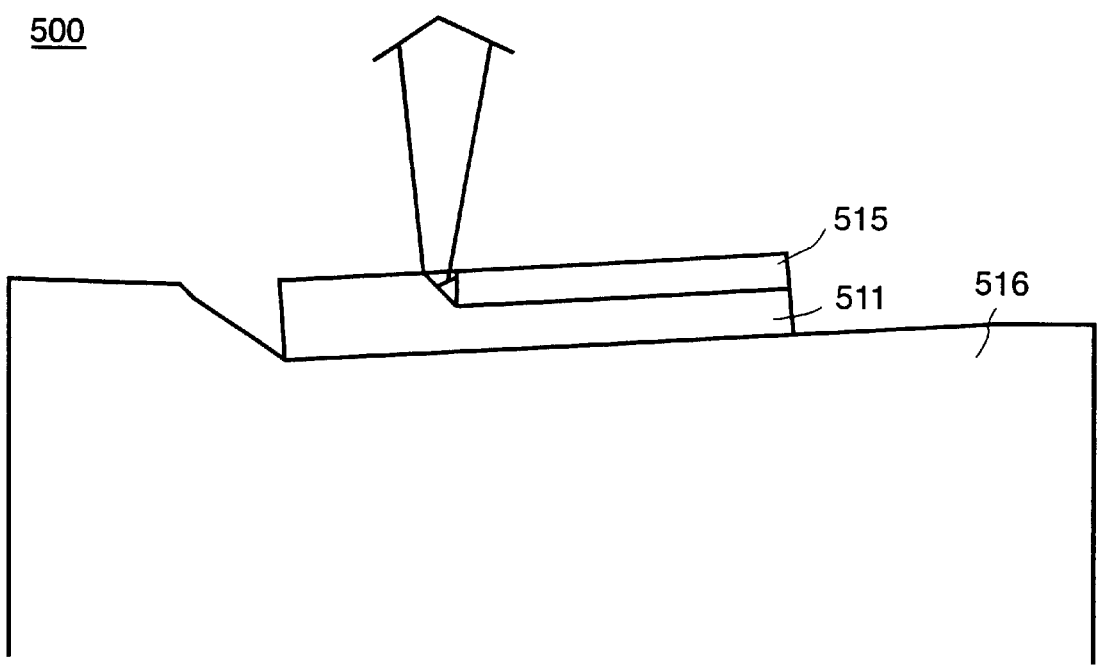

FIGS. 5A and 5B are sectional views showing a schematic structure of a laser diode assembly according to a fifth embodiment of the present invention. Here, FIG. 5A shows a sub-mount of the laser diode assembly, and FIG. 5B shows the laser diode assembly comprising the sub-mount disposed on a heat-sink.

The difference between the laser diode assembly 500 of the fifth embodiment and the above-explained embodiments is that the laser diode is integrally manufactured on the sub-mount.

Number 511 in FIGS. 5A and 5B represents a sub-mount 511 made of a 9-degree-off GaAs substrate whose surface is inclined 9 degrees with respect to a (100) GaAs surface. A red semiconductor laser diode 515 containing InGaAlP is manufactured on the sub-mount 511. Conventionally, such an "off substrate" is prepared to manufacture the red semiconductor laser diode 515 thereon, so as to avoid generation of natural ordered super lattice. Edge surfaces 523 and 524 of the laser diode 515 are processed by means of etching. A slanted surface 525, facing the edge surface 523, is also formed by anisotropic etching or selective crystal growth, and $SiO_2$ is then evaporated thereon to maintain electric insulation, and Au is further coated thereby realizing function as a mirror. However, this slanted surface 525 as a mirror is not inclined 45 degrees in general, with respect to the GaAs substrate surface. Therefore, the sub-mount 511 on which the laser diode 515 is manufactured is secured on a mount 516, thereby providing the laser diode assembly 500 capable of guiding the laser beam to the vertical direction.

In this embodiment, the laser diode assembly 500 is achieved without involving a cleavage step. by employing etching to form the edge surfaces. Accordingly. it is possible to estimate the characteristics of the laser diode easily and to improve yield of the laser diode.

In the above-explained embodiment. silicon is used to manufacture the sub-mount, however, GaAs, GaP, InP and the like can be used instead. As for a reflective material. silver and dielectric multi-layer film can be used instead of gold.

Specific method of positioning the sub-mount on the mount will be described hereinafter.

As stated above, the sub-mount can be positioned by using the step such as V-shaped step or the like formed on the mount. In addition to this, an optical method can be used to position the sub-mount onto the mount in order to increase accuracy thereof.

For example, a positioning mark is provided on the predetermined portion of the mount. The sub-mount is put on the mount and is then shifted slightly to adjust the position thereof along with the V-shaped step or the rectangular step, based on the position of the mark. The mount and the sub-mount are fixed together with a photo-curing type adhesive or the like when the relative position thereof is properly adjusted.

This method makes it possible to position the sub-mount precisely on the mount, even though the V-shaped step and the rectangular step are not employed.

There is also provided a method for positioning the sub-mount, apart from the above-explained method, that utilizes a stripe grid pattern and a checkerboard grid pattern that are usually employed for positioning a mask and a wafer in manufacturing a semiconductor. This method makes it possible to position the sub-mount along with the direction of thickness thereof, as well as other directions.

Figure 6:
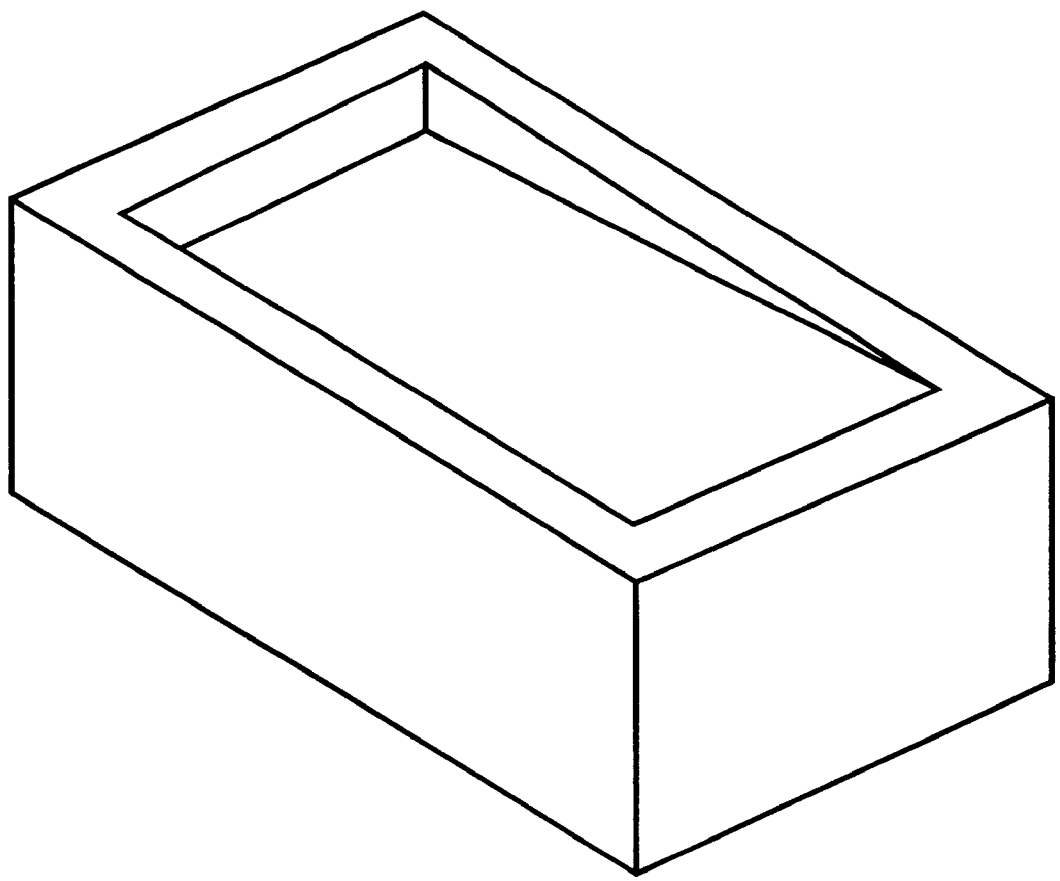
FIG. 6 is a perspective view showing a modified example of the mount of the present invention.

Other than the optical methods as explained above, a mechanical method can be employed for positioning the sub-mount on the mount. In the above-explained methods, the V-shaped step and the rectangular step are used to fix one of surfaces of the sub-mount. On the contrary, a U-shaped mount 816. as shown in FIG. 6. allows fixing to two or three surfaces of the sub-mount thereby positioning the sub-mount precisely and automatically. Cutting, grinding, etching and the like can be employed to form the U-shaped mount 816.

Figure 7:
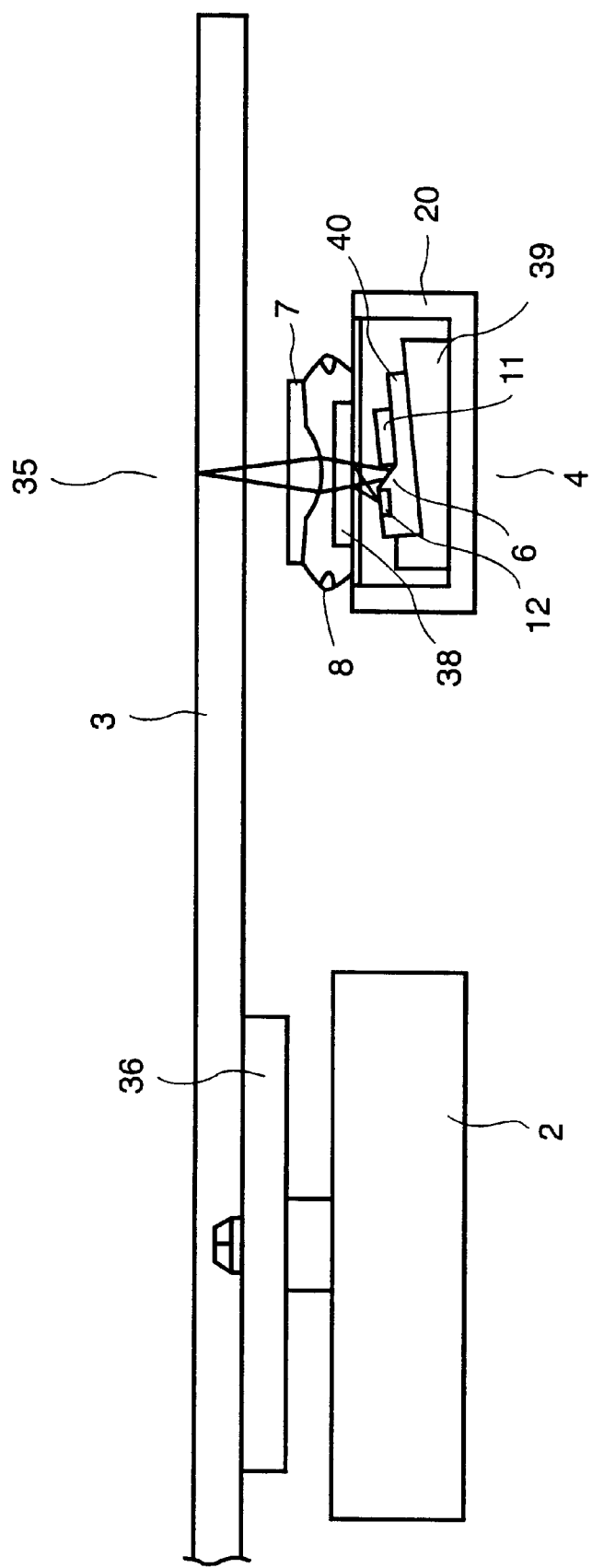
FIG. 7 is a sectional view showing an internal structure of the optical head apparatus which is a modified embodiment of the present invention.

Hereinafter. one preferred modification of the laser diode assembly of the present invention to an optical head apparatus will be specifically described. FIG. 7 is a sectional view showing an internal structure of the optical head apparatus. In FIG. 7, a mechanism for driving an objective lens and the like is not shown.

In FIG. 7, the optical head apparatus 35 is equipped with a spindle motor 2 coupled with a stable base portion (not shown), a chucking mechanism 36 such as a magnetic chucking mechanism connected to the spindle motor 2, and a disk (optical recording medium) 3 for recording and/or reproducing information such as CD-ROM, MO (Magneto-Optical disk) and DVD (Digital Versatile Disk) held by the chucking mechanism 36. The spindle motor 2 rotates disk 3 stably during the recording/reproducing of information.

At the lower surface of the disk 3, there is provided a carriage 20 and an optical head 4 is mounted thereon. The optical head 4 is equipped with a laser diode assembly 40 of the present invention having a laser diode 11 and a photo detector 12, a reflecting mirror 6 that reflects a laser beam irradiated from the laser diode 11 to the direction perpendicular to the surface of the disk 3 and reflects a laser beam reflected by the disk 3 to the photo detector 12, an objective lens 7 disposed on the upper portion of the optical head 4 facing the recording surface of the disk 3 for condensing the laser beam from the reflecting mirror 6 to the recording surface of the disk 3 thereby generating a beam spot thereon, and an objective lens holder 8 that holds the objective lens 7. In the vicinity of the laser diode assembly 40, there is provided a HOE (Holographic Optical Element) 38 that diffracts the laser beam irradiated by the laser diode. A blue semiconductor laser diode as the laser diode 11 is disposed on front side of the laser diode assembly 40, a heat sink 39 having a plurality of protruding portions for improving heat radiation is disposed on the back side thereof.

The optical head apparatus 35 such constituted is capable of reproducing information being recorded on the disk 3, as well as controlling a focal point of the objective lens 7, such as tracking control and focusing control. Accordingly, the beam spot generated by the objective lens 7 can be scanned precisely above required tracks on the disk 3. The laser diode assembly 40 of the present invention makes it possible to guide the laser beam from the laser diode 11 to the vertical direction, and to realize miniaturizing and lightening of the optical head 4 which is a main structure of the optical head apparatus 35.

Figure 8:
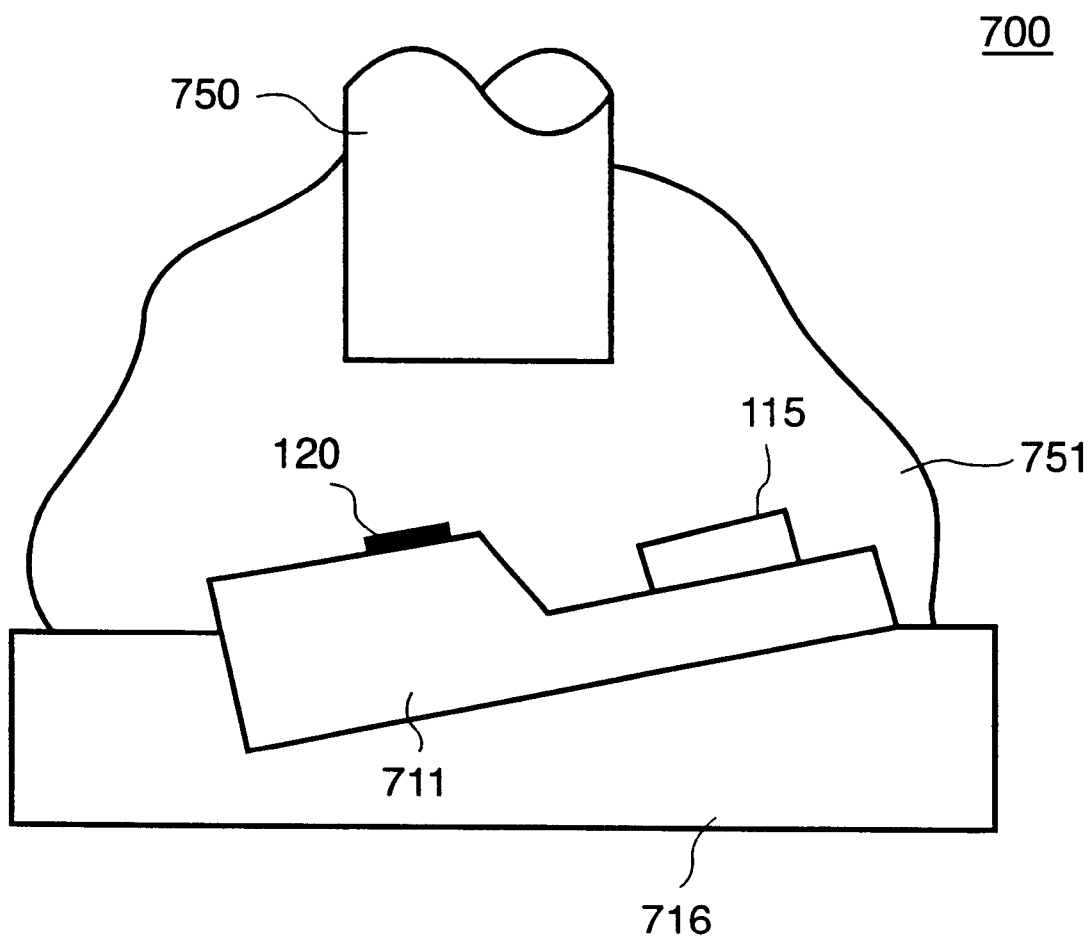
FIG. 8 is a sectional view showing a main structure of the optical transceiver apparatus which is a modified embodiment of the present invention.

Next, another preferred modification of the laser diode assembly of the present invention to an optical transceiver apparatus will be specifically described. FIG. 8 is a sectional view showing a main structure of the optical transceiver apparatus, and FIG. 9 is a schematic view showing an optical transceiver system using the optical transceiver apparatus.

As shown in FIG. 8, basic structure of a transceiver terminal 700 is the same as of the above-explained laser diode assembly. In this modified embodiment, a sub-mount 711 is secured on a heat-sink 716, and an optical fiber 750 is positioned in a manner that the edge surface of the optical fiber 750 allows to enter a laser beam. The optical fiber 750 is covered with an adhesive 751 to be fixed. It is desirable that the adhesive 751 has enough transparency to transmit the laser beam between the laser diode 115 and the optical fiber 750. An epoxy resin or the like is selected as the adhesive 751.

Figure 9:
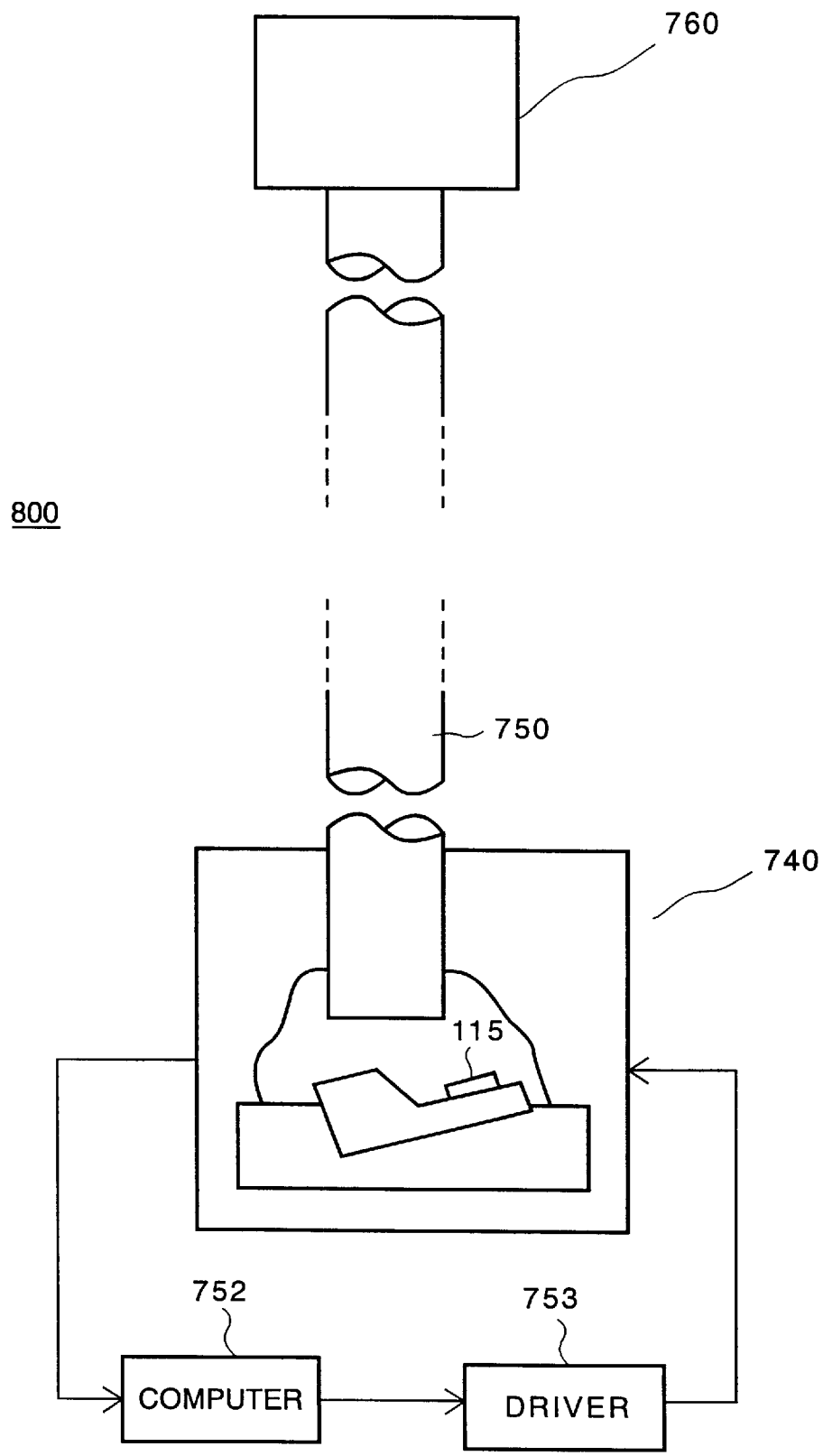
FIG. 9 is a schematic view showing an optical transceiver system using the optical transceiver apparatus as shown in FIG. 8.

The transceiver apparatus 700 shown in FIG. 8 is employed to an input terminal and an output terminal so as to constitute the optical transceiver system 800 shown in FIG. 9. Information signal generated by a computer 752 of a transmitting terminal 740 is input to a driver 753, and the laser diode 115 is controlled in accordance with the information signal. The laser beam irradiated from the laser diode 115 is guided to a receiving terminal 760 through the optical fiber 750. The laser beam input to a photo detector of the receiving terminal 760 is converted again to the information signal to be used for data processing. Here, the transmitting terminal 740 and the receiving terminal 760 are distinguished to make explanation easier, however, each of these terminals 740 and 760 can have both functions in an actual system.

Although one transmitting terminal and one receiving terminal are shown in this modified embodiment, further terminals can be linked by a photo coupler or the like to constitute arbitrary size of network. Thereby, a large amount of information can be shared through the network.

As describe above in detail, the present invention makes it possible to guide the laser beam to a predetermined direction by utilizing the mirror surface which has arbitrary angle with respect to the sub-mount.

In particular, the (111) mirror surface having 54.74 degrees on the inexpensive (100) silicon substrate in cubic crystal and the mount having 19.48 degrees can be coupled. This means that both of two (111) surfaces simultaneously obtained from the (100) silicon substrate by etching can be used as mirrors. In the case of employing 9.74-degree-off substrate in cubic crystal, a 64.47-degree-surface which used to be waste can be utilized as a sub-mount, by securing a mount having a surface inclined 38.94 degrees, thereby guiding the laser beam to the perpendicular direction. The present invention, therefore, makes it possible to realize an inexpensive laser diode assembly.

The foregoing discussion discloses and describes merely an exemplary embodiment of the present invention. As will be understood by those skilled in the art, the present invention may be embodied in other specific forms without departing from the spirit or essential characteristics thereof Accordingly, the disclosure of the present invention is intended to be illustrative, but not limiting. of the scope of the invention, which is set forth in the following claims. The entire contents of Japanese Patent Application H10-278766, filed Sep. 30, 1998, is incorporated herein by reference.

What is claimed is:

1. A laser diode assembly, comprising:
   a mount having a first surface and a mounting surface inclined to the first surface;
   a sub-mount made of a semiconductor substrate disposed on the mounting surface of the mount, the sub-mount having a second surface that coincides with a (100) surface of the semiconductor substrate and a reflecting surface that coincides with a (111) surface of the semiconductor substrate inclined to the second surface; and
   a laser diode on the second surface for irradiating the reflecting surface with a laser beam along a direction parallel to the second surface;
   wherein the second surface is parallel to the mounting surface and an angle between a reflected laser beam from the reflecting surface and the first surface is substantially 90 degrees.

2. The laser diode assembly according to claim 1, wherein an inclined angle of the mounting surface with respect to the first surface is 19.48 degrees, and an inclined angle of the reflecting surface with respect to the second surface is 54.74 degrees.

3. The laser diode assembly according to claim 1, wherein the semiconductor substrate is previously processed by anisotropic etching to form the reflecting surface.

4. The laser diode assembly according to claim 1, wherein the sub-mount comprises silicon.

5. The laser diode assembly according to claim 4, wherein the second surface coincides with a (100) silicon surface.

6. The laser diode assembly according to claim 1, wherein gold is evaporated on the reflecting surface.

7. The laser diode assembly according to claim 1, wherein a step is formed by the first surface and the mounting surface.

8. The laser diode assembly according to claim 7, wherein the step is used to adjust at least one portion of the sub-mount.

9. The laser diode assembly according to claim 1, wherein the laser diode is integrally manufactured on the sub-mount.

10. The laser diode assembly according to claim 1, further comprising a photo detector for detecting an optical signal on the second surface of the sub-mount.

11. The laser diode assembly according to claim 1, further comprising an optical transceiver material for guiding the laser beam to a predetermined position.

12. A mount unit, comprising:
    a mount having a first surface and a mounting surface inclined to the first surface;
    a sub-mount disposed on the mounting surface of the mount, the sub-mount having a second surface and a reflecting surface inclined to the second surface, the second surface being parallel to the mounting surface,
    wherein, when the reflecting surface is irradiated with a light along a direction parallel to the second surface, an angle between a reflected light from the reflecting surface and the first surface is substantially 90 degrees.

13. The mount unit according to claim 12, farther comprising a laser diode on the second surface for irradiating a laser beam parallel to the second surface.

14. The mount unit according to claim 12, wherein the first surface and the mounting surface form a step.

15. The mount unit according to claim 14, wherein the step is used to adjust at least one portion of the sub-mount.

16. An optical head apparatus for recording/reproducing information onto/from an optical recording medium, comprising:
    an optical head capable of moving relative to the optical recording medium, the optical head including a first unit having a first surface and a mounting surface inclined to the first surface, and a second unit comprising a semiconductor substrate on the first unit and having a second surface and a reflecting surface that coincides with a (111) surface of the semiconductor substrate inclined to the second surface;
    a laser diode on the second surface of the optical head for irradiating the reflecting surface with a laser beam along a direction parallel to the second surface; and
    a lens for condensing the laser beam onto the optical recording medium,
    wherein the second surface of the second unit is parallel to the mounting surface, and an angle between a reflected laser beam from the reflecting surface and the first surface is substantially 90 degrees.

17. The optical head apparatus according to claim 16, wherein the first surface and the mounting surface form a step.

18. The optical head apparatus according to claim 17,wherein the step is used to adjust at least one portion of the second unit.

19. A transceiver apparatus having at least a pair of terminals for transmitting/receiving optical information, each terminal comprising:
    a first unit having a first surface and a mounting surface inclined to the first surface;
    a second unit made of a semiconductor substrate on the first unit, having a second surface and a reflecting surface that coincides with a (111) surface of the semiconductor substrate inclined to the second surface; and
    a laser diode on the second surface for irradiating the reflecting surface with a laser beam along a direction parallel to the second surface;
    wherein the second surface is parallel to the mounting surface, and an angle between a reflected laser beam from the reflecting surface and the first surface is substantially 90 degrees.

* * * * *